United States Patent
Motoyama et al.

(10) Patent No.: US 8,228,133 B2
(45) Date of Patent: Jul. 24, 2012

(54) UNBALANCED-BALANCED CONVERTER

(75) Inventors: Hiroto Motoyama, Saku (JP); Hironobu Kimura, Saku (JP); Yasuhiko Mizutani, Komaki (JP)

(73) Assignee: Soshin Electric Co., Ltd., Saku (JP)

( * ) Notice: Subject to any disclaimer, the term of this patent is extended or adjusted under 35 U.S.C. 154(b) by 318 days.

(21) Appl. No.: 12/663,604

(22) PCT Filed: Jul. 2, 2008

(86) PCT No.: PCT/JP2008/061952
§ 371 (c)(1),
(2), (4) Date: Dec. 8, 2009

(87) PCT Pub. No.: WO2009/005079
PCT Pub. Date: Jan. 8, 2009

(65) Prior Publication Data
US 2010/0253443 A1    Oct. 7, 2010

(30) Foreign Application Priority Data
Jul. 3, 2007    (JP) .................. 2007-175517

(51) Int. Cl.
 *H03H 7/42*    (2006.01)
 *H01P 3/08*    (2006.01)
(52) U.S. Cl. .......................... 333/25; 333/238
(58) Field of Classification Search .............. 333/25, 333/26, 238, 5
See application file for complete search history.

(56) References Cited

U.S. PATENT DOCUMENTS

| | | | |
|---|---|---|---|
| 6,150,897 A | 11/2000 | Nishikawa et al. | |
| 7,397,328 B2 * | 7/2008 | Yasuda et al. | 333/204 |
| 7,468,640 B2 | 12/2008 | Nosaka | |
| 2003/0025571 A1 | 2/2003 | Maekawa et al. | |

FOREIGN PATENT DOCUMENTS

| | | |
|---|---|---|
| 3P | 2002-299127 A1 | 10/2002 |
| JP | 10-335911 A1 | 12/1998 |
| JP | 11-214943 A1 | 8/1999 |
| JP | 2004-056745 | 2/2004 |
| JP | 2005-333011 A1 | 12/2005 |
| WO | 2005/076404 A1 | 12/2008 |

OTHER PUBLICATIONS

Stephen A. Maas et al., "*A Broadband, Planar, Doubly Balanced Monolithic Ka-Band Diode Mixer*," IEEE Transactions on Microwave Theory and Techniques, vol. 41, No. 12, Dec. 1993, pp. 2330-2335.

* cited by examiner

*Primary Examiner* — Dean O Takaoka
(74) *Attorney, Agent, or Firm* — Burr & Brown

(57) ABSTRACT

A first balance electrode unit electrically connected to a pair of balance terminals (a first balance terminal and a second balance terminal) is formed on a main surface of a fourth dielectric layer sandwiched by an upper grounding electrode and a lower grounding electrode in a dielectric substrate. A second balance electrode unit electrically connected to a pair of balance terminals on the main surface of a seventh dielectric layer. An unbalance electrode unit electrically connected to an unbalance terminal is formed on the main surface of a fifth dielectric layer.

4 Claims, 12 Drawing Sheets

UNBALANCED-BALANCED CONVERTER

FIELD OF THE INVENTION

The present invention relates to an unbalanced-balanced converter having one unbalance electrode and two balance electrodes in a dielectric substrate.

BACKGROUND OF THE INVENTION

Baluns (unbalanced-balanced converters) are widely known as circuit components for converting unbalanced input/output to balanced input/output or converting balanced input/output to unbalanced input/output.

In recent years, high integration of semiconductor parts such as integrated circuits (IC) has developed, and also miniaturization of the semiconductor parts per se has rapidly advanced. Accordingly, miniaturization of the baluns has been advancing.

As shown as an example in FIG. 12, a conventional balun 100 contains a ½-wavelength unbalanced transmission line 102 and a pair of ¼-wavelength balanced transmission lines 104, 106 (see Patent Document 1).

One end of the unbalanced transmission line 102 has an unbalanced input terminal 108 of the balun 100, and the other end is an open end. One end of each balanced transmission line 104, 106 has a balanced output terminal 110, 112 of the balun 100, and the other end is grounded.

Furthermore, as described in Patent Document 2 and Non-Patent Document 1, improved marchand baluns have been proposed.

In the case of using the improved marchand balun, the even-mode characteristic impedance can be increased, and phase velocities of both modes can be made close to each other, thereby resulting in excellent circuit characteristics.

Patent Document 1: Japanese Laid-Open Patent Publication No. 2002-299127
Patent Document 2: Japanese Laid-Open Patent Publication No. 10-335911
Non-Patent Document 1: IEEE TRANSACTIONS ON MICROWAVE THEORY AND TECHNIQUES, VOL. 41, NO. 12, DECEMBER 1993, pp. 2330-2335 [A Broadband, Planar, Doubly Balanced Monolithic Ka-Band Diode Mixer]

SUMMARY OF THE INVENTION

However, disadvantageously, the balun 100 described in Patent Document 1 cannot have a wider bandwidth, and the baluns described in Patent Document 2 and Non-Patent Document 1 cannot be downsized though can have a wider bandwidth.

In view of such problems, an object of the present invention is to provide an unbalanced-balanced converter that can be practically obtained by forming an improved marchand balun in one dielectric substrate and can have a wider effective bandwidth, a smaller size, and a lower loss.

An unbalanced-balanced converter according to the present invention comprises a dielectric substrate containing a stack of a plurality of dielectric layers, an upper ground electrode and a lower ground electrode formed in an upper part and a lower part of the dielectric substrate, and at least an unbalance terminal and a pair of balance terminals formed on an outer surface of the dielectric substrate, wherein an element formation region is disposed between the upper and lower ground electrodes in the dielectric substrate, a first balance electrode part electrically connected to the pair of balance terminals is formed on a first formation surface in the element formation region, a second balance electrode part electrically connected to one of the balance terminals is formed on a second formation surface in the element formation region, an unbalance electrode part electrically connected to the unbalance terminal is formed on a third formation surface between the first and second formation surfaces in the element formation region, the first balance electrode part has first and second coil patterns, the second balance electrode part has third and fourth coil patterns, each of the first and third coil patterns is electrically connected at one end to one of the pair of balance terminals, the first and third coil patterns are electrically connected at the other ends, each of the second and fourth coil patterns is electrically connected at one end to the other of the pair of balance terminals, the second and fourth coil patterns are electrically connected at the other ends, the unbalance electrode part has a fifth and sixth coil patterns, the fifth and sixth coil patterns are electrically connected at one ends, the upper and lower surfaces of the fifth coil pattern face the first and third coil patterns respectively, and the upper and lower surfaces of the sixth coil pattern face the second and fourth coil patterns respectively.

In this manner, an improved marchand balun can be practically formed in one dielectric substrate, and the unbalanced-balanced converter can have an increased effective bandwidth, a smaller size, and a reduced loss. A conventional distributed parameter circuit containing rectangular strip lines is disadvantageous in that there is a certain requirement for the length in the line direction (for example, the circuit has to have a length corresponding to a ¼ wavelength), whereby the size of the circuit may be increased depending on the band used. In contrast, since the converter of the present invention is composed of the coil patterns, the requirement for the length in the line direction is advantageously reduced, and thus the converter can be highly freely designed in view of miniaturization.

The unbalanced-balanced converter of the present invention may be such that the first coil pattern has a spiral shape formed in one direction from a first central end to a first outer end, the second coil pattern has a spiral shape formed in the other direction from a second central end to a second outer end, the third coil pattern has a spiral shape formed in one direction from a third central end to a third outer end, the fourth coil pattern has a spiral shape formed in the other direction from a fourth central end to a fourth outer end, the fifth coil pattern has a spiral shape formed in one direction from a fifth central end electrically connected to the unbalance terminal, the sixth coil pattern has a spiral shape formed in the other direction from a sixth central end, the first outer end of the first coil pattern and the third outer end of the third coil pattern are electrically connected to the one balance terminal, the first central end of the first coil pattern and the third central end of the third coil pattern are electrically connected, the second outer end of the second coil pattern and the fourth outer end of the fourth coil pattern are electrically connected to the other balance terminal, and the second central end of the second coil pattern and the fourth central end of the fourth coil pattern are electrically connected.

In this case, the unbalanced-balanced converter may be such that a first DC electrode, to which a direct current signal is supplied, is formed on a fourth formation surface between the upper ground electrode and the first formation surface in the element formation region, a second DC electrode, to which the direct current signal is supplied, is formed on a fifth formation surface between the lower ground electrode and the third formation surface in the element formation region, the first central end of the first coil pattern and the second central end of the second coil pattern in the first balance electrode part are electrically connected to the first DC electrode, and the third central end of the third coil pattern and the fourth central end of the fourth coil pattern in the second balance electrode part are electrically connected to the second DC electrode.

Furthermore, the unbalanced-balanced converter of the present invention may be such that the first coil pattern has a spiral shape formed in one direction from a first central end electrically connected to the one balance terminal, the second coil pattern has a spiral shape formed in the other direction from a second central end electrically connected to the other balance terminal, the first and second coil patterns are electrically connected in a first position, the third coil pattern has a spiral shape formed in one direction from a third central end electrically connected to the one balance terminal, the fourth coil pattern has a spiral shape formed in the other direction from a fourth central end electrically connected to the other balance terminal, the third and fourth coil patterns are electrically connected in a second position, the fifth coil pattern has a spiral shape formed in one direction from a fifth central end to a fifth outer end, the sixth coil pattern has a spiral shape formed in the other direction from a sixth central end, the fifth and sixth central ends are electrically connected, the fifth outer end is electrically connected to the unbalance terminal, a first connection electrode for electrically connecting the first central end of the first coil pattern to the one balance terminal and a second connection electrode for electrically connecting the second central end of the second coil pattern to the other balance terminal are formed on a sixth formation surface between the upper ground electrode and the first formation surface in the element formation region, a third connection electrode for electrically connecting the third central end of the third coil pattern to the one balance terminal and a fourth connection electrode for electrically connecting the fourth central end of the fourth coil pattern to the other balance terminal are formed on a seventh formation surface between the lower ground electrode and the second formation surface, and a fifth connection electrode for electrically connecting the fifth central end of the fifth coil pattern to the sixth central end of the sixth coil pattern is formed on an eighth formation surface between the first and second formation surfaces, the eighth formation surface being different from the third formation surface.

In this case, the unbalanced-balanced converter may be such that a first DC electrode, to which a direct current signal is supplied, is formed on a fourth formation surface between the upper ground electrode and the first formation surface in the element formation region, a second DC electrode, to which the direct current signal is supplied, is formed on a fifth formation surface between the lower ground electrode and the third formation surface in the element formation region, the first and second DC electrodes are electrically connected in a DC terminal formed on an outer surface of the dielectric substrate, a connection between the first and second coil patterns in the first position is electrically connected to the DC terminal, and a connection between the third and fourth coil patterns in the second position is electrically connected to the DC terminal.

As described above, in the present invention, the improved marchand balun having excellent circuit characteristics can be practically formed in one dielectric substrate, and the resultant unbalanced-balanced converter can have an increased effective bandwidth, a smaller size, and a reduced loss.

DETAILED DESCRIPTION OF THE INVENTION

An embodiment of the unbalanced-balanced converter of the present invention will be described below with reference to FIGS. 1 to 11.

Figure 1:
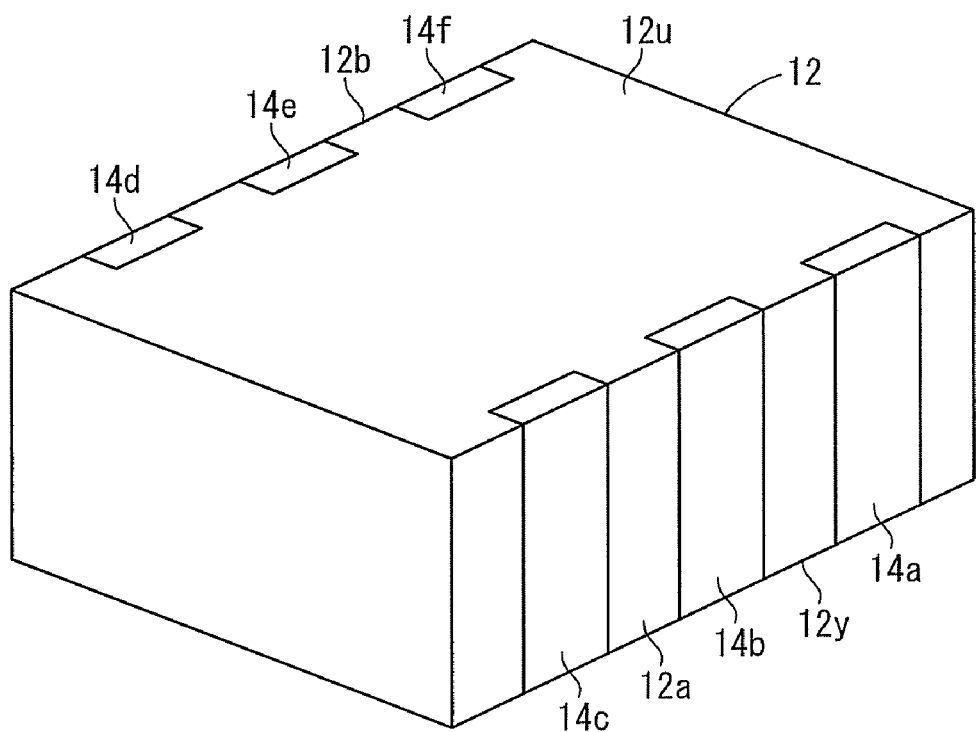
FIG. 1 is a perspective view showing the appearance of a first balun.

As shown in FIG. 1, an unbalanced-balanced converter according to a first embodiment (hereinafter referred to simply as the first balun 10A) contains a dielectric substrate 12 formed by stacking, burning, and integrating a plurality of dielectric layers (dielectric layers S1 to S10 shown in FIG. 2). In the outer surfaces of the dielectric substrate 12, three terminals 14a to 14c are formed on a first side surface 12a, and three terminals 14d to 14f are formed on a second side surface 12b (a side surface opposite to the first side surface 12a). Each of the terminals 14a to 14f extends continuously from a position on an upper surface 12u to a position on a lower surface 12y.

The terminals 14a to 14f include, for example, an NC terminal 14a (a terminal not connected to electrodes) formed in a right portion of the first side surface 12a, a ground terminal 14b formed in a center portion of the first side surface 12a, and a terminal for an unbalanced transmission line (to be referred to as an unbalance terminal) 14c formed in a left portion of the first side surface 12a.

The three terminals 14d to 14f formed on the second side surface 12b include a first terminal for a balanced transmission line (to be referred to as a first balance terminal hereinafter) 14d opposite to the unbalance terminal 14c, a DC terminal 14e (to which a direct current signal is supplied) opposite to the ground terminal 14b, and a second terminal for a balanced transmission line (to be referred to as a second balance terminal hereinafter) 14f opposite to the NC terminal 14a.

Figure 2:
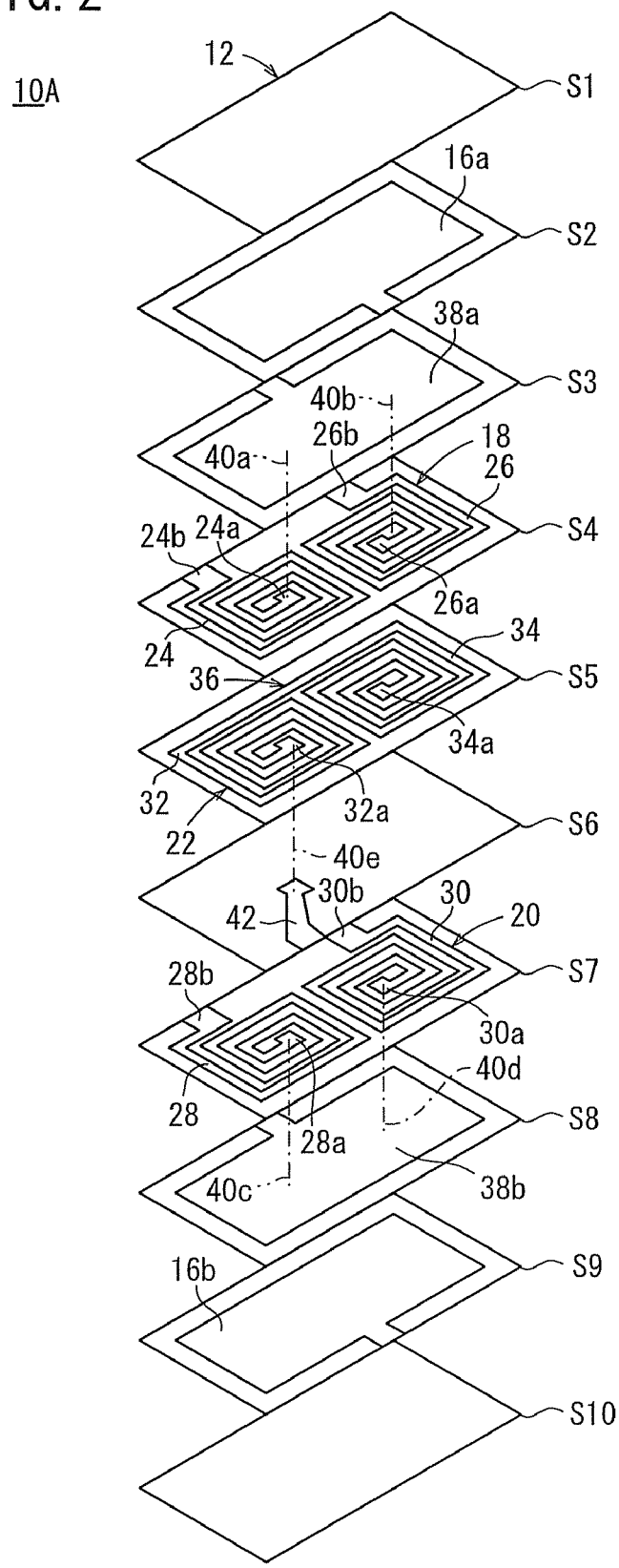
FIG. 2 is an exploded perspective view showing the structure of the first balun.

As shown in FIG. 2, the dielectric substrate 12 is formed by stacking the first to tenth dielectric layers S1 to S10 in this order from above. Each of the first to tenth dielectric layers S1 to S10 has a mono- or multi-layer structure.

In the first balun 10A, an upper ground electrode 16a is formed in an upper part of the dielectric substrate 12, and a lower ground electrode 16b is formed in a lower part of the dielectric substrate 12. Specifically, the upper ground electrode 16a is formed on a main surface of the second dielectric layer S2, and the lower ground electrode 16b is formed on a main surface of the ninth dielectric layer S9.

Furthermore, in the first balun 10A, an element formation region is disposed between the upper ground electrode 16a and the lower ground electrode 16b in the dielectric substrate 12, a first electrode part for a balanced transmission line (to be referred to as a first balance electrode part hereinafter) 18 electrically connected to the pair of balance terminals (the first balance terminal 14d and the second balance terminal 14f) is formed on a first formation surface (a main surface of the fourth dielectric layer S4) in the element formation region, a second electrode part for a balanced transmission line (to be referred to as a second balance electrode part hereinafter) 20 electrically connected to the pair of balance terminals (14d, 14f) is formed on a second formation surface (a main surface of the seventh dielectric layer S1) in the element formation region, and an electrode part for an unbalanced transmission line (to be referred to as an unbalance electrode part 22 hereinafter) 22 electrically connected to the unbalance terminal 14c is formed on a third formation surface (a main surface of the fifth dielectric layer S5) between the first and second formation surfaces in the element formation region.

The first balance electrode part 18 has a first coil pattern 24 and a second coil pattern 26. The first coil pattern 24 has a spiral shape formed in one direction from a first central end 24a to a first outer end 24b. The second coil pattern 26 has a spiral shape formed in the other direction from a second central end 26a to a second outer end 26b. The first outer end 24b of the first coil pattern 24 is electrically connected to the first balance terminal 14d, and the second outer end 26b of the second coil pattern 26 is electrically connected to the second balance terminal 14f.

The second balance electrode part 20 has a third coil pattern 28 and a fourth coil pattern 30. The third coil pattern 28 has a spiral shape formed in one direction from a third central end 28a to a third outer end 28b. The fourth coil pattern 30 has a spiral shape formed in the other direction from a fourth central end 30a to a fourth outer end 30b. The third outer end 28b of the third coil pattern 28 is electrically connected to the first balance terminal 14d, and the fourth outer end 30b of the fourth coil pattern 30 is electrically connected to the second balance terminal 14f.

The unbalance electrode part 22 has a fifth coil pattern 32 and a sixth coil pattern 34, and the fifth coil pattern 32 and the sixth coil pattern 34 are electrically connected in a first position 36. The fifth coil pattern 32 has a spiral shape formed in one direction from a fifth central end 32a electrically connected to the unbalance terminal 14c. The sixth coil pattern 34 has a spiral shape formed in the other direction from a sixth central end 34a.

In the first balun 10A, a first electrode for DC (to be referred to as a first DC electrode hereinafter) 38a electrically connected to the DC terminal 14e is formed on a fourth formation surface (a main surface of the third dielectric layer S3) between the upper ground electrode 16a and the first formation surface, and a second electrode for DC (to be referred to as a second DC electrode hereinafter) 38b electrically connected to the DC terminal 14e is formed on a fifth formation surface (a main surface of the eighth dielectric layer S8) between the lower ground electrode 16b and the second formation surface.

The first central end 24a of the first coil pattern 24 and the second central end 26a of the second coil pattern 26 in the first balance electrode part 18 are electrically connected to the first DC electrode 38a by a first via hole 40a and a second via hole 40b respectively, and the third central end 28a of the third coil pattern 28 and the fourth central end 30a of the fourth coil pattern 30 in the second balance electrode part 20 are electrically connected to the second DC electrode 38b by a third via hole 40c and a fourth via hole 40d respectively.

Furthermore, a connection electrode 42 for electrically connecting the fifth central end 32a of the fifth coil pattern 32 in the unbalance electrode part 22 to the unbalance terminal 14c is formed on a sixth formation surface (a main surface of the sixth dielectric layer S6) between the first formation surface (the main surface of the fourth dielectric layer S4) and the second formation surface (the main surface of the seventh dielectric layer S7), the sixth formation surface being different from the third formation surface. Specifically, the fifth central end 32a of the fifth coil pattern 32 is electrically connected to the unbalance terminal 14c by the connection electrode 42 and a fifth via hole 40e. The sixth central end 34a of the sixth coil pattern 34 is not electrically connected to any on the sixth formation surface.

Figure 3:
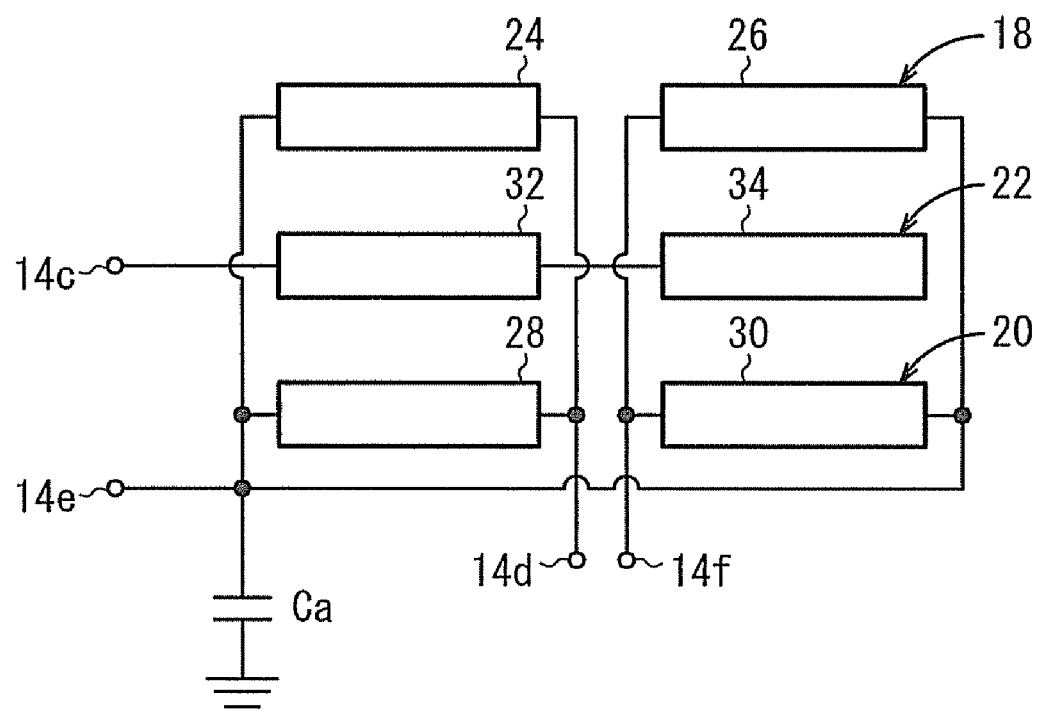
FIG. 3 is an equivalent circuit schematically showing the structure of the first balun.

As shown in FIG. 3, in an equivalent circuit of the first balun 10A, the fifth coil pattern 32 of the unbalance electrode part 22 is connected to the unbalance terminal 14c at one end, the first coil pattern 24 of the first balance electrode part 18 and the third coil pattern 28 of the second balance electrode part 20 face the fifth coil pattern 32 of the unbalance electrode part 22, and the second coil pattern 26 of the first balance electrode part 18 and the fourth coil pattern 30 of the second balance electrode part 20 face the sixth coil pattern 34 of the unbalance electrode part 22.

Each of the first coil pattern 24 of the first balance electrode part 18 and the third coil pattern 28 of the second balance electrode part 20 is connected at one end to the first balance terminal 14d, and each of the second coil pattern 26 of the first balance electrode part 18 and the fourth coil pattern 30 of the second balance electrode part 20 is connected at one end to the second balance terminal 14f.

Additionally, the other ends of the first coil pattern 24 of the first balance electrode part 18 and the third coil pattern 28 of the second balance electrode part 20 and the other ends of the second coil pattern 26 of the first balance electrode part 18 and the fourth coil pattern 30 of the second balance electrode part 20 are connected to the DC terminal 14e and connected to GND (ground) through a capacitance Ca respectively.

As shown in FIG. 2, the capacitance Ca is the total of a capacitance formed between the upper ground electrode 16a and the first DC electrode 38a and a capacitance formed between the lower ground electrode 16b and the second DC electrode 38b, and acts as a capacitor for preventing short circuit of the direct current signal.

In a first experimental example, properties of the first balun 10A were examined. Particularly the widening improvement degree of effective bandwidth was determined by comparison with the conventional balun 100. The bandwidth widening was evaluated using fractional bandwidth.

Figure 4:
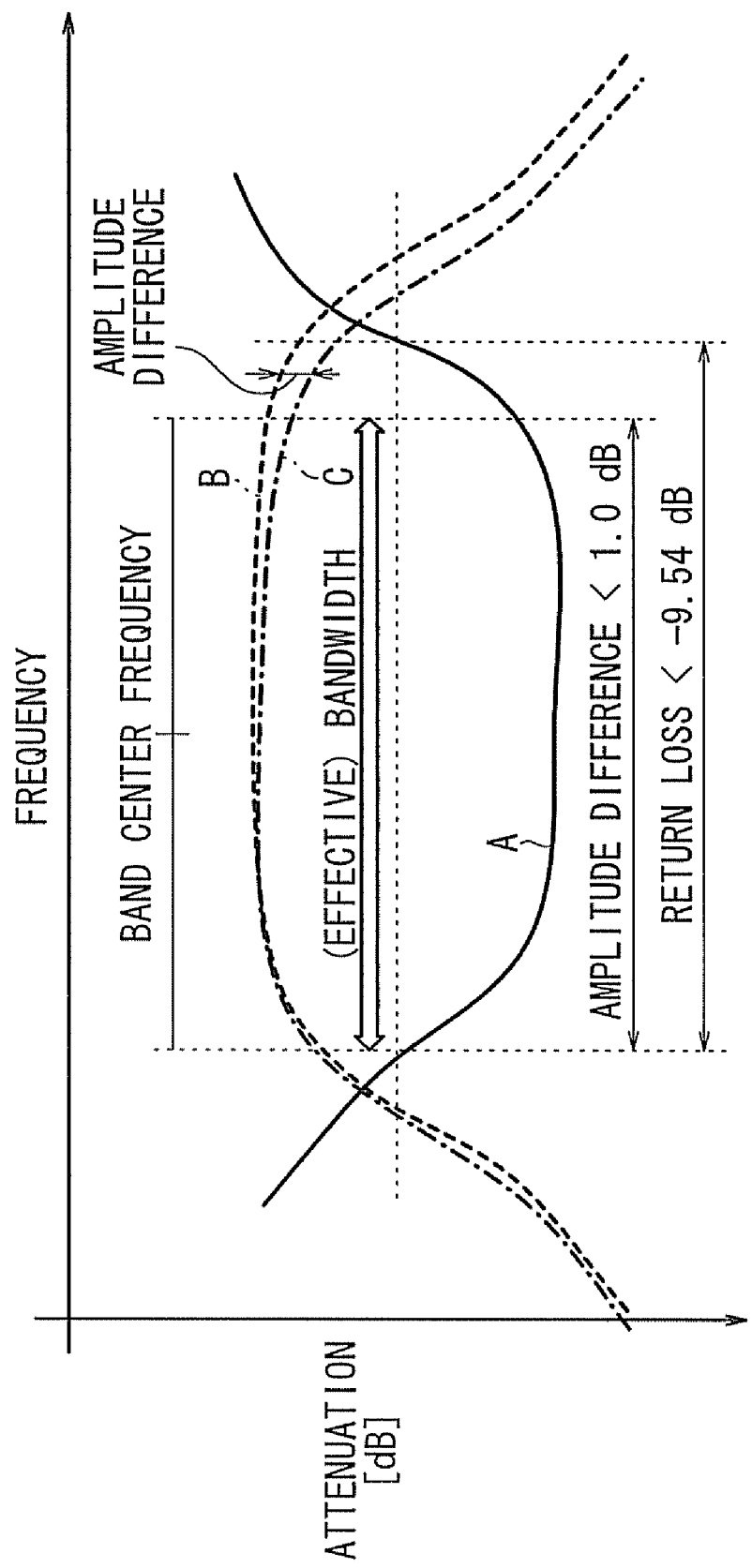
FIG. 4 is a chart for explaining fractional bandwidth.

The fractional bandwidth used in the first experimental example is described below with reference to FIG. 4. The characteristics of the input reflection to the unbalance terminal 14c (S11, Curve A), the first transmission from the unbalance terminal 14c to the first balance terminal 14d (S21, Curve B), and the second transmission from the unbalance terminal 14c to the second balance terminal 14f (S31, Curve C) in the balun are shown in FIG. 4.

A bandwidth, in which the return loss due to the input reflection characteristic (S11) is −9.54 dB or less and the difference (the amplitude difference) between the first transmission characteristic (S21) and the second transmission characteristic (S31) is 1.0 dB or less, is defined as the effective bandwidth. A value obtained by dividing the effective bandwidth by the band center frequency is defined as the fractional bandwidth. Thus, when the obtained fractional bandwidth is a larger value, the balun has a wider bandwidth.

Figure 5:
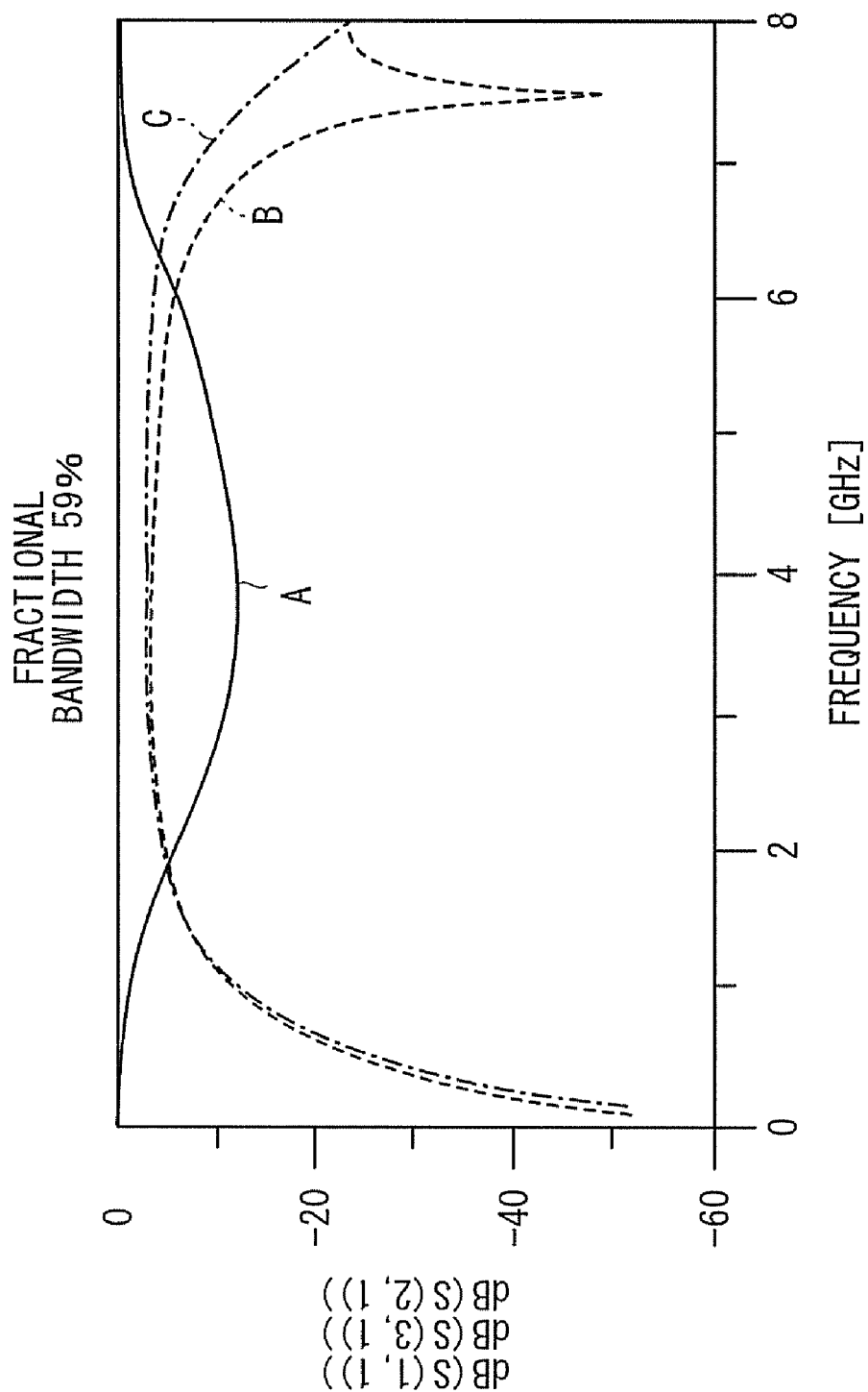
FIG. 5 is a chart showing the input reflection characteristic, first transmission characteristic, and second transmission characteristic of a conventional balun in a first experimental example.
Figure 12:
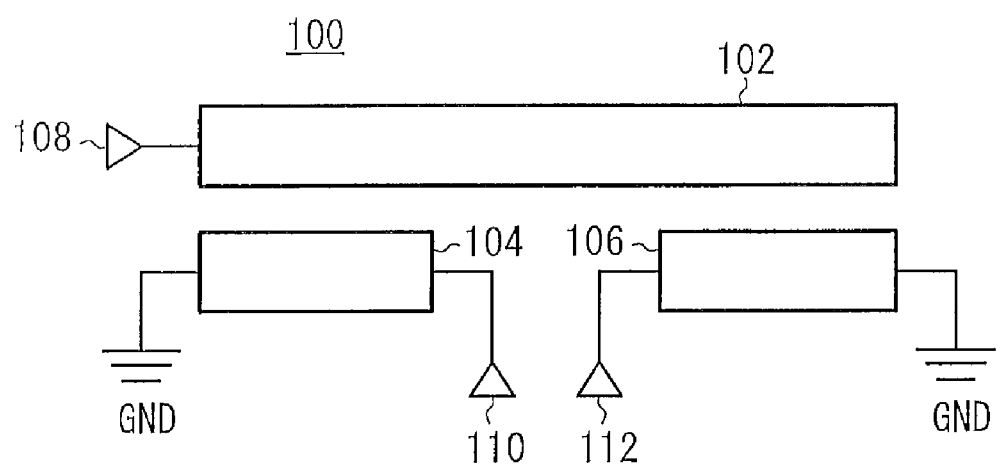
FIG. 12 is an equivalent circuit schematically showing the structure of the conventional balun.

The conventional balun 100 shown in FIG. 12 exhibited the input reflection characteristic (S11, Curve A), the first transmission characteristic (S21, Curve B), and the second transmission characteristic (S31, Curve C) shown in FIG. 5, and had a fractional bandwidth of 59%.

Figure 6:
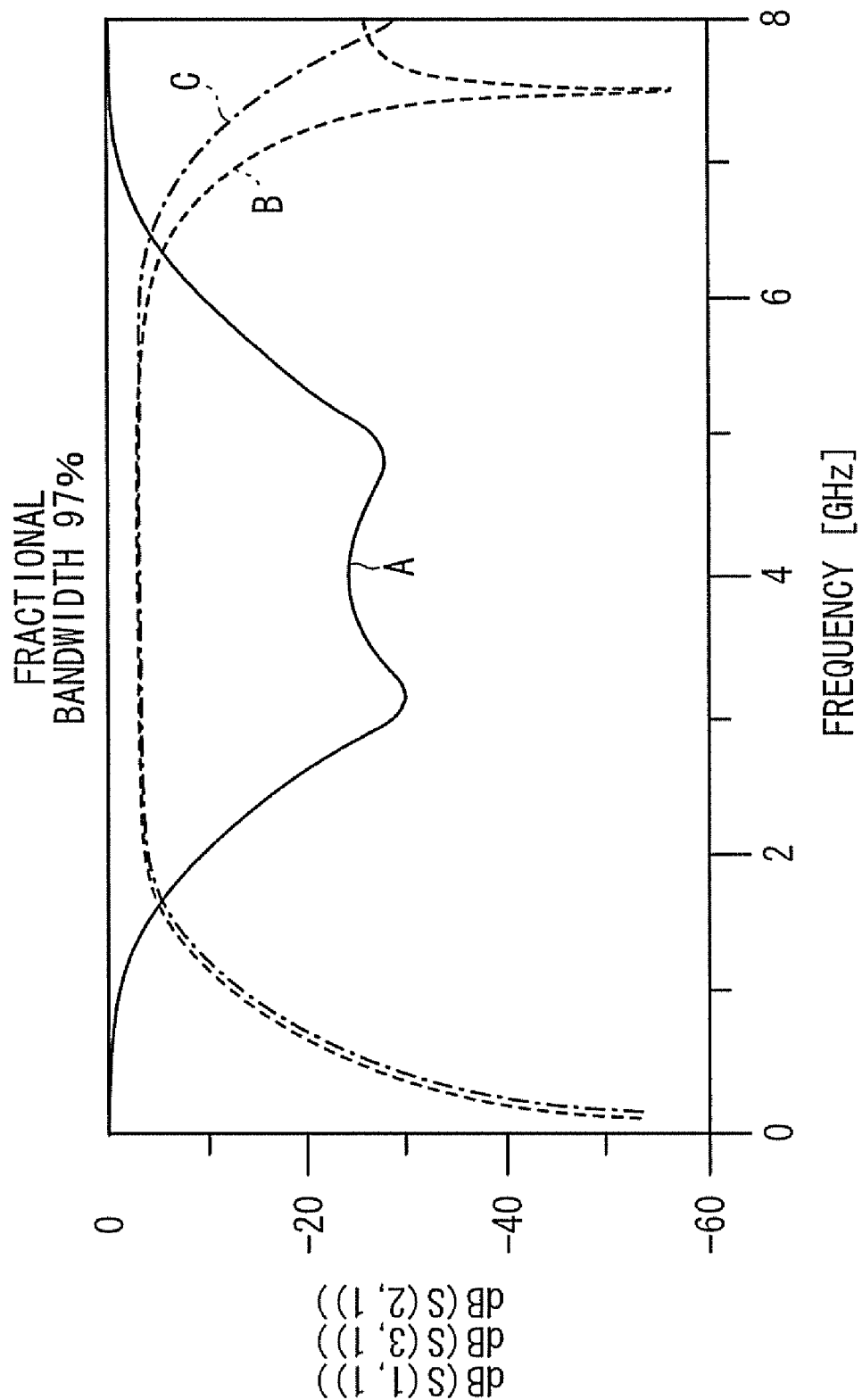
FIG. 6 is a chart showing the input reflection characteristic, first transmission characteristic, and second transmission characteristic of the first balun in the first experimental example.

In contrast, the first balun 10A shown in FIGS. 1 and 2 exhibited the input reflection characteristic (S11, Curve A), the first transmission characteristic (S21, Curve B), and the second transmission characteristic (S31, Curve C) shown in FIG. 6, and had a fractional bandwidth of 97%.

Thus, it is clear that the first balun 10A has an effective bandwidth significantly larger than that of the conventional balun. It should be understood that since the first balun 10A contains the unbalance electrode part 22 sandwiched between the first balance electrode part 18 and the second balance electrode part 20, the first balun 10A can exhibit a larger even-mode characteristic impedance and closer phase velocities of both modes, resulting in excellent circuit characteristics.

The first balun 10A can be downsized. A conventional distributed parameter circuit containing rectangular strip lines is disadvantageous in that there is a certain requirement for the length in the line direction (for example, the circuit has to have a length corresponding to a ¼ wavelength), whereby the size of the circuit may be increased depending on the band used. In contrast, since the first balance electrode part 18, the second balance electrode part 20, and the unbalance electrode part 22 in the first balun 10A are composed of the coil patterns, respectively, there is no requirement for the length in the line direction, and thus the first balun 10A can be highly freely designed in view of miniaturization.

Figure 7:
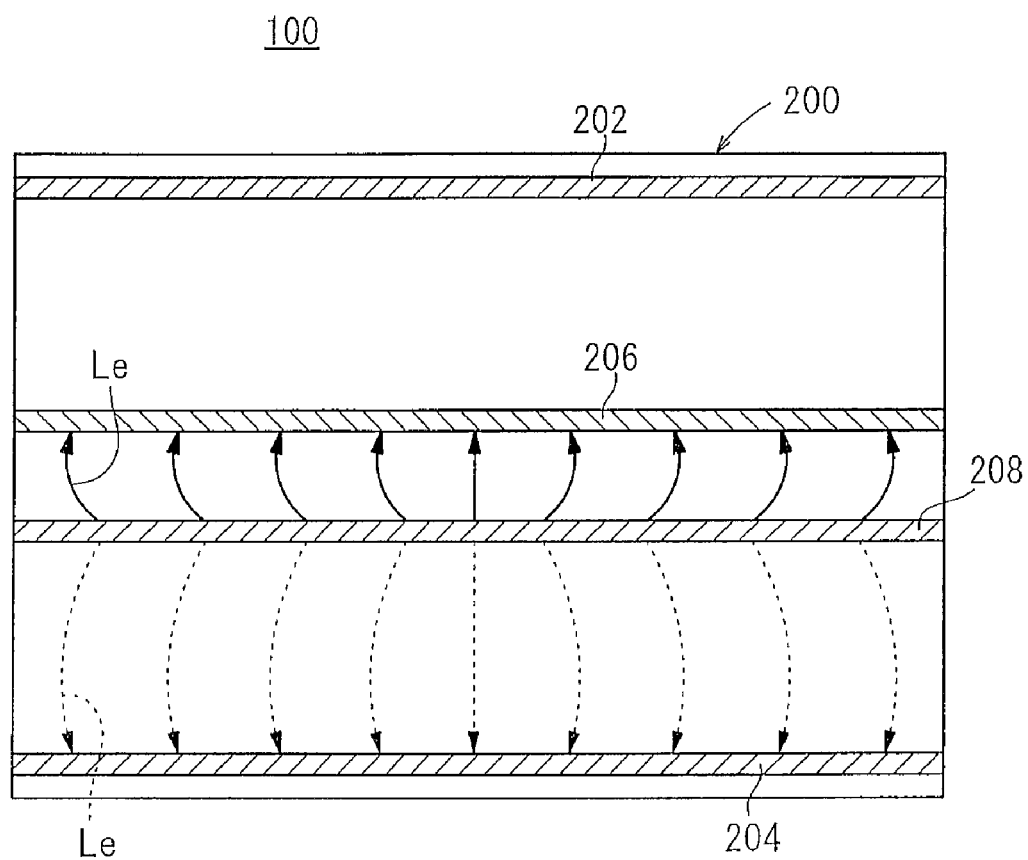
FIG. 7 is a model view showing the structure of the conventional balun.

The first balun 10A can be used with low loss. For example, as shown in FIG. 7, the conventional balun 100 has such a structure that one electrode part for a balanced transmission line (to be referred to as a balance electrode part) 206 faces one electrode part for a unbalanced transmission line (to be referred to as an unbalanced electrode part) 208 between an upper ground electrode 202 and a lower ground electrode 204 in a dielectric substrate 200. As a result, electric lines of force Le are emitted from the unbalance electrode part 208 to the balance electrode part 206, and are emitted also to the lower ground electrode 204. The emission of the electric lines of force Le to the lower ground electrode 204 result in increase of insertion loss disadvantageously.

Figure 8:
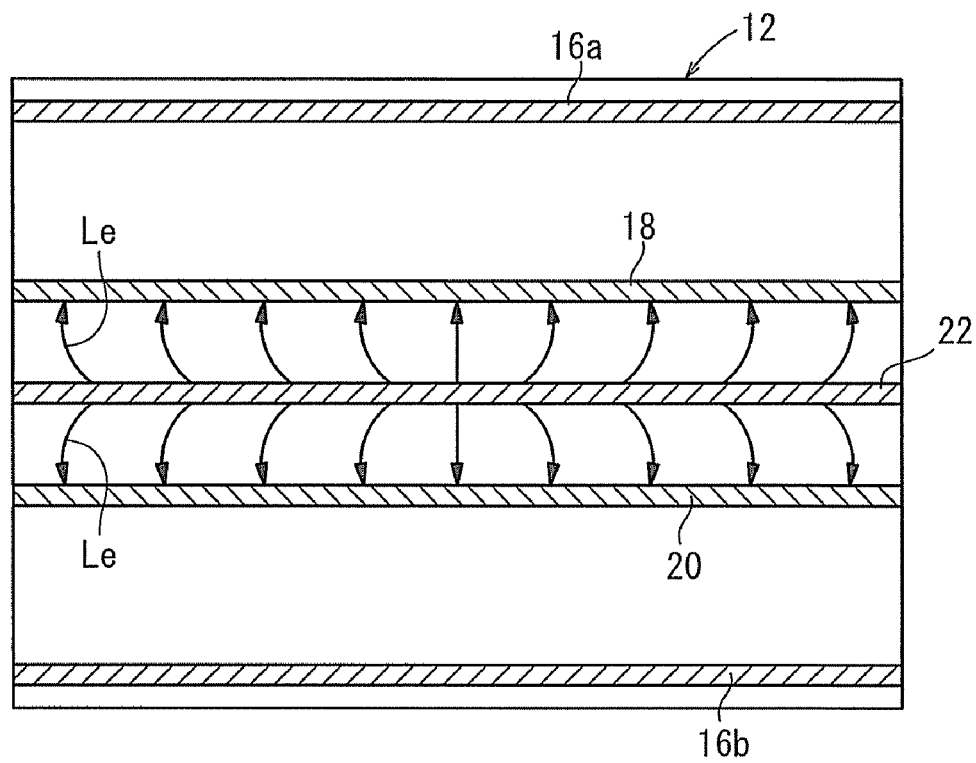
FIG. 8 is a model view showing the structure of the first balun.

In contrast, as shown in FIG. 8, the first balun 10A contains one unbalance electrode part 22, the first balance electrode part 18 facing the upper surface of the unbalance electrode part 22, and the second balance electrode part 20 facing the lower surface of the unbalance electrode part 22 between the upper ground electrode 16a and the lower ground electrode 16b in the dielectric substrate 12. As a result, the emission of electric lines of force Le from the unbalance electrode part 22 to the lower ground electrode 16b are prevented to reduce insertion loss. In addition, the balanced line is composed of the two layers of the first balance electrode part 18 and the second balance electrode part 20, so that the conductor area can be increased. Thus, the current density in the first balance electrode part 18 and the second balance electrode part 20 can be lowered to reduce the insertion loss.

Then, one experimental example (a second experimental example) is described below. In the second experimental example, the insertion loss reduction degree of the first balun 10A was determined by comparison with the conventional balun 100.

Figure 9:
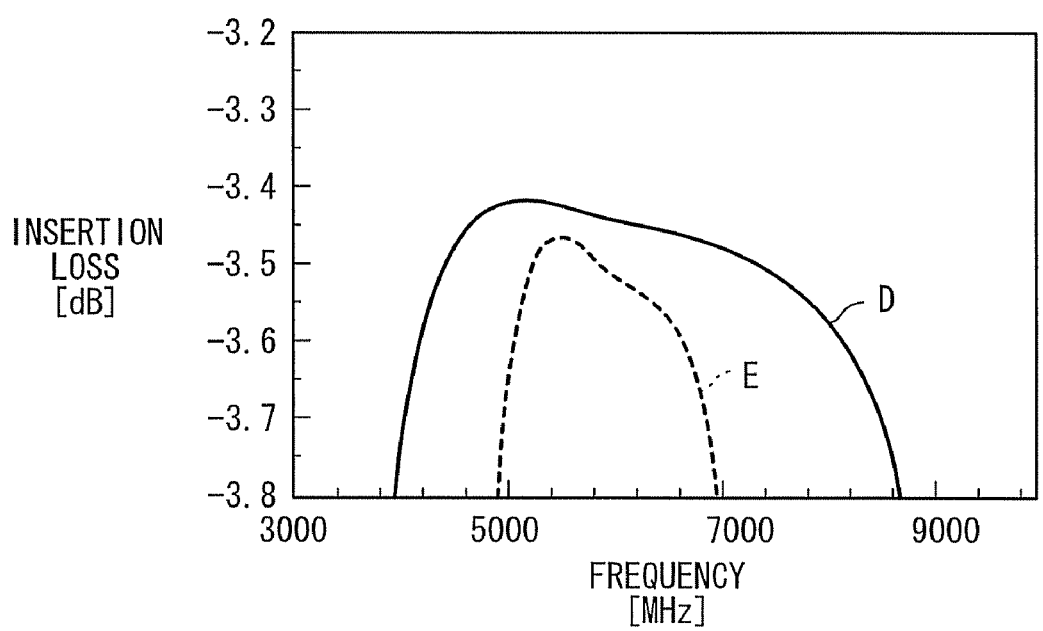
FIG. 9 is a graph showing the results of a second experimental example (insertion loss characteristics).

In the second experimental example, the conditions were changed from those of the first experimental example. The circuit constant of the conventional balun 100 was changed such that excellent bandwidth matching was achieved between the conventional balun 100 and the first balun 10A (at a higher band frequency), and the insertion loss difference between the conventional balun 100 and the first balun 10A were compared under no reflection loss conditions. The experiment results are shown in FIG. 9. In FIG. 9, the continuous line D represents the characteristics of the first balun 10A, and the dashed line E represents the characteristics of the conventional balun 100.

As shown in FIG. 9, the conventional balun 100 exhibited an insertion loss peak of −3.46 dB, and the first balun 10A exhibited an insertion loss peak of −3.41 dB, so that the difference was as much as 0.05 dB. Thus, it is clear that the first balun 10A has a loss lower than that of the conventional balun 100.

An unbalanced-balanced converter according to a second embodiment (hereinafter referred to simply as the second balun 10B) will be described below with reference to FIGS. 10 and 11.

Figure 10:
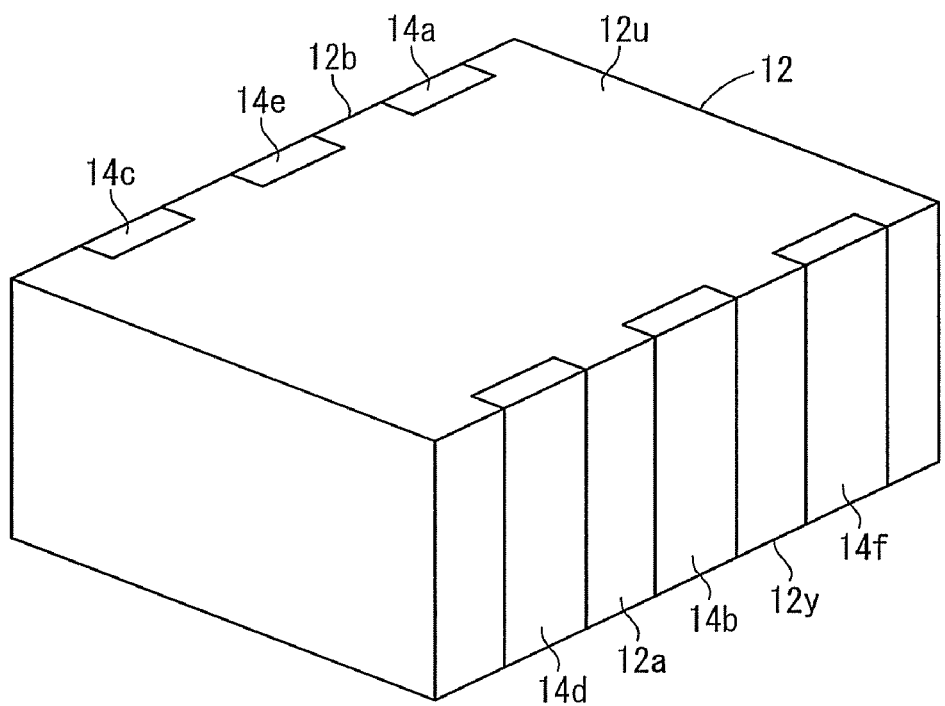
FIG. 10 is a perspective view showing the appearance of a second balun.

As shown in FIG. 10, for example, on a first side surface 12a of a dielectric substrate 12 in the second balun 10B, a first balance terminal 14d is formed in a left portion, a ground terminal 14b is formed in a center portion, and a second balance terminal 14f is formed in a right portion.

Three terminals formed on a second side surface include an unbalance terminal 14c opposite to the above-mentioned first balance terminal 14d, a DC terminal 14e (to which a direct current signal is supplied) opposite to the above-mentioned ground terminal 14b, and an NC terminal 14a (a terminal not connected to electrodes) opposite to the above-mentioned second balance terminal 14f.

Figure 11:
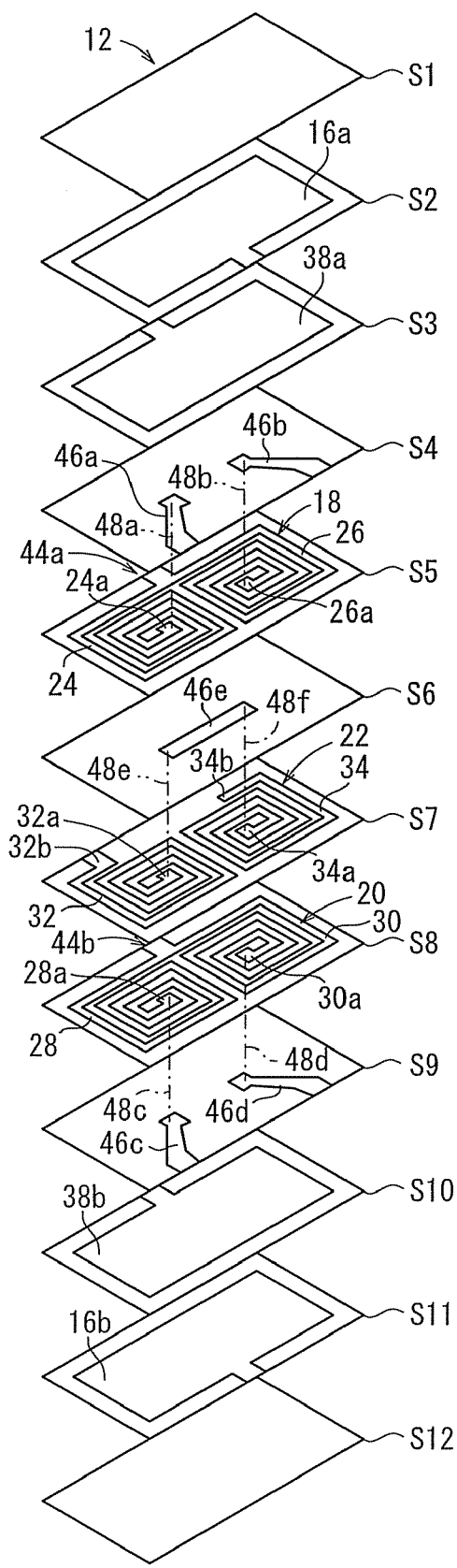
FIG. 11 is an exploded perspective view showing the structure of the second balun.

As shown in FIG. 11, the dielectric substrate 12 is formed by stacking first to twelfth dielectric layers S1 to S12 in this order from above. Each of the first to twelfth dielectric layers S1 to S12 has a mono- or multi-layer structure.

In the second balun 10B, an upper ground electrode 16a is formed on a main surface of the second dielectric layer S2, and a lower ground electrode 16b is formed on a main surface of the eleventh dielectric layer S11.

Furthermore, in the second balun 10B, an element formation region is disposed between the upper ground electrode 16a and the lower ground electrode 16b in the dielectric substrate 12, a first balance electrode part 18 electrically connected to the pair of balance terminals (the first balance terminal 14d and the second balance terminal 14f) is formed on a first formation surface (a main surface of the fifth dielectric layer S5) in the element formation region, a second balance electrode part 20 electrically connected to the pair of balance terminals is formed on a second formation surface (a main surface of the eighth dielectric layer S8) in the element formation region, and an unbalance electrode part 22 electrically connected to the unbalance terminal 14c is formed on a third formation surface (a main surface of the seventh dielectric layer S1) between the first and second formation surfaces in the element formation region.

In the first balance electrode part 18, a first coil pattern 24 and a second coil pattern 26 are electrically connected in a first position 44a, the first coil pattern 24 has a spiral shape formed in one direction from a first central end 24a (electrically connected to the first balance terminal 14d) to the first position 44a, and the second coil pattern 26 has a spiral shape formed in the other direction from a second central end 26*a* (electrically connected to the second balance terminal 14*f*) to the first position 44*a*.

In the second balance electrode part 20, a third coil pattern 28 and a fourth coil pattern 30 are electrically connected in a second position 44*b*, the third coil pattern 28 has a spiral shape formed in one direction from a third central end 28*a* (electrically connected to the first balance terminal 14*d*) to the second position 44*b*, and the fourth coil pattern 30 has a spiral shape formed in the other direction from a fourth central end 30*a* (electrically connected to the second balance terminal 14*f*) to the second position 44*b*.

In the unbalance electrode part 22, a fifth coil pattern 32 has a spiral shape formed in one direction from a fifth central end 32*a* to a fifth outer end 32*b*, and the fifth outer end 32*b* is electrically connected to the unbalance terminal 14*c*. A sixth coil pattern 34 has a spiral shape formed in the other direction from a sixth central end 34*a*, and a sixth outer end 34*b* is not electrically connected to any on the same formation surface.

In the second balun 10B, a first DC electrode 38*a* electrically connected to the DC terminal 14*e* is formed on a fourth formation surface (a main surface of the third dielectric layer S3) between the upper ground electrode 16*a* and the first formation surface, and a second DC electrode 38*b* electrically connected to the DC terminal 14*e* is formed on a fifth formation surface (a main surface of the tenth dielectric layer S10) between the lower ground electrode 16*b* and the second formation surface.

A connection between the first coil pattern 24 and the second coil pattern 26 in the first position 44*a* of the first balance electrode part 18 is electrically connected to the DC terminal 14*e*, and a connection between the third coil pattern 28 and the fourth coil pattern 30 in the second position 44*b* of the second balance electrode part 20 is electrically connected to the DC terminal 14*e*.

Furthermore, a first connection electrode 46*a* (which electrically connects the first central end 24*a* of the first coil pattern 24 in the first balance electrode part 18 to the first balance terminal 14*d*) and a second connection electrode 46*b* (which electrically connects the second central end 26*a* of the second coil pattern 26 to the second balance terminal 14*f*) are formed on a sixth formation surface (a main surface of the fourth dielectric layer S4) between the upper ground electrode 16*a* and the first formation surface. Specifically, the first central end 24*a* of the first coil pattern 24 is electrically connected to the first balance terminal 14*d* by the first connection electrode 46*a* and an eleventh via hole 48*a*, and the second central end 26*a* of the second coil pattern 26 is electrically connected to the second balance terminal 14*f* by the second connection electrode 46*b* and a twelfth via hole 48*b*.

In the same manner, a third connection electrode 46*c* (which electrically connects the third central end 28*a* of the third coil pattern 28 in the second balance electrode part 20 to the first balance terminal 14*d*) and a fourth connection electrode 46*d* (which electrically connects the fourth central end 30*a* of the fourth coil pattern 30 to the second balance terminal 14*f*) are formed on a seventh formation surface (a main surface of the ninth dielectric layer S9) between the lower ground electrode 16*b* and the second formation surface. Specifically, the third central end 28*a* of the third coil pattern 28 is electrically connected to the first balance terminal 14*d* by the third connection electrode 46*c* and a thirteenth via hole 48*c*, and the fourth central end 30*a* of the fourth coil pattern 30 is electrically connected to the second balance terminal 14*f* by the fourth connection electrode 46*d* and a fourteenth via hole 48*d*.

A fifth connection electrode 46*e* (which electrically connects the fifth central end 32*a* of the fifth coil pattern 32 to the sixth central end 34*a* of the sixth coil pattern 34 in the unbalance electrode part 22) is formed on an eighth formation surface (a main surface of the sixth dielectric layer S6) between the first and second formation surfaces, the eighth formation surface being different from the third formation surface. Specifically, the fifth central end 32*a* of the fifth coil pattern 32 is electrically connected to the fifth connection electrode 46*e* by a fifteenth via hole 48*e*, and the sixth central end 34*a* of the sixth coil pattern 34 is electrically connected to the fifth connection electrode 46*e* by a sixteenth via hole 48*f*.

As with the first balun 10A, the second balun 10B can have an effective bandwidth significantly larger than that of the conventional balun, can be downsized, and can be used with low loss. Furthermore, since the second balun 10B contains the unbalance electrode part 22 sandwiched between the first balance electrode part 18 and the second balance electrode part 20, the second balun 10B can exhibit a larger even-mode characteristic impedance and closer phase velocities of both modes, resulting in excellent circuit characteristics.

Though the first DC electrode 38*a* and the second DC electrode 38*b* are formed in the dielectric substrate in the above embodiment, the first DC electrode 38*a* and the second DC electrode 38*b* may be omitted.

Though each of the coil patterns (the first coil pattern 24 to the sixth coil pattern 34) is formed in a quadrangular shape in the above embodiment, the coil pattern may be in a circular, polygonal, or meander shape.

It should be understood that the unbalanced-balanced converter of the present invention is not limited to the above embodiments, and various changes and modifications may be made therein without departing from the scope of the invention.

The invention claimed is:

1. An unbalanced-balanced converter comprising
a dielectric substrate containing a stack of a plurality of dielectric layers,
an upper ground electrode and a lower ground electrode formed in an upper part and a lower part of the dielectric substrate, and
at least an unbalance terminal and a pair of balance terminals formed on an outer surface of the dielectric substrate, wherein
an element formation region is disposed between the upper ground electrode and the lower ground electrode in the dielectric substrate,
a first balance electrode part electrically connected to the pair of balance terminals is formed on a first formation surface in the element formation region,
a second balance electrode part electrically connected to one of the balance terminals is formed on a second formation surface in the element formation region,
an unbalance electrode part electrically connected to the unbalance terminal is formed on a third formation surface between the first formation surface and the second formation surface in the element formation region,
the first balance electrode part has a first coil pattern and a second coil pattern,
the second balance electrode part has a third coil pattern and a fourth coil pattern,
each of the first coil pattern and the third coil pattern is electrically connected at one end to one balance terminal of the pair of balance terminals,
the first coil pattern and the third coil pattern are electrically connected at the other ends, each of the second coil pattern and the fourth coil pattern is electrically connected at one end to the other balance terminal of the pair of balance terminals, the second coil pattern and the fourth coil pattern are electrically connected at the other ends, the unbalance electrode part has a fifth coil pattern and a sixth coil pattern, the fifth coil pattern and the sixth coil pattern are electrically connected at one ends, and the upper and lower surfaces of the fifth coil pattern face the first coil pattern and the third coil pattern, respectively, and the upper and lower surfaces of the sixth coil pattern face the second coil pattern and the fourth coil pattern, respectively, wherein the first coil pattern has a spiral shape formed in one direction from a first central end to a first outer end, the second coil pattern has a spiral shape formed in the other direction from a second central end to a second outer end, the third coil pattern has a spiral shape formed in one direction from a third central end to a third outer end, the fourth coil pattern has a spiral shape formed in the other direction from a fourth central end to a fourth outer end, the fifth coil pattern has a spiral shape formed in one direction from a fifth central end electrically connected to the unbalance terminal, the sixth coil pattern has a spiral shape formed in the other direction from a sixth central end, the first outer end of the first coil pattern and the third outer end of the third coil pattern are electrically connected to the one balance terminal, the first central end of the first coil pattern and the third central end of the third coil pattern are electrically connected, the second outer end of the second coil pattern and the fourth outer end of the fourth coil pattern are electrically connected to the other balance terminal, and the second central end of the second coil pattern and the fourth central end of the fourth coil pattern are electrically connected.

2. An unbalanced-balanced converter according to claim 1, wherein a first DC electrode, to which a direct current signal is supplied, is formed on a fourth formation surface between the upper ground electrode and the first formation surface in the element formation region, a second DC electrode, to which the direct current signal is supplied, is formed on a fifth formation surface between the lower ground electrode and the third formation surface in the element formation region, the first central end of the first coil pattern and the second central end of the second coil pattern in the first balance electrode part are electrically connected to the first DC electrode, and the third central end of the third coil pattern and the fourth central end of the fourth coil pattern in the second balance electrode part are electrically connected to the second DC electrode.

3. An unbalanced-balanced converter according to claim 1, wherein the first coil pattern has a spiral shape formed in one direction from a first central end electrically connected to the one balance terminal, the second coil pattern has a spiral shape formed in the other direction from a second central end electrically connected to the other balance terminal, the first coil pattern and the second coil pattern are electrically connected in a first position, the third coil pattern has a spiral shape formed in one direction from a third central end electrically connected to the one balance terminal, the fourth coil pattern has a spiral shape formed in the other direction from a fourth central end electrically connected to the other balance terminal, the third coil pattern and the fourth coil pattern are electrically connected in a second position, the fifth coil pattern has a spiral shape formed in one direction from a fifth central end to a fifth outer end, the sixth coil pattern has a spiral shape formed in the other direction from a sixth central end, the fifth central end and the sixth central end are electrically connected, and the fifth outer end is electrically connected to the unbalance terminal, a first connection electrode for electrically connecting the first central end of the first coil pattern to the one balance terminal and a second connection electrode for electrically connecting the second central end of the second coil pattern to the other balance terminal are formed on a sixth formation surface between the upper ground electrode and the first formation surface in the element formation region, a third connection electrode for electrically connecting the third central end of the third coil pattern to the one balance terminal and a fourth connection electrode for electrically connecting the fourth central end of the fourth coil pattern to the other balance terminal are formed on a seventh formation surface between the lower ground electrode and the second formation surface, and a fifth connection electrode for electrically connecting the fifth central end of the fifth coil pattern to the sixth central end of the sixth coil pattern is formed on an eighth formation surface between the first formation surface and the second formation surface, the eighth formation surface being different from the third formation surface.

4. An unbalanced-balanced converter according to claim 3, wherein a first DC electrode, to which a direct current signal is supplied, is formed on a fourth formation surface between the upper ground electrode and the first formation surface in the element formation region, a second DC electrode, to which the direct current signal is supplied, is formed on a fifth formation surface between the lower ground electrode and the third formation surface in the element formation region, the first DC electrode and the second DC electrode are electrically connected in a DC terminal formed on the outer surface of the dielectric substrate, a connection between the first coil pattern and the second coil pattern in the first position is electrically connected to the DC terminal, and a connection between the third coil pattern and the fourth coil pattern in the second position is electrically connected to the DC terminal.

* * * * *